United States Patent [19]
Look et al.

[11] Patent Number: 5,150,042
[45] Date of Patent: Sep. 22, 1992

[54] ON-WAFER HALL-EFFECT MEASUREMENT SYSTEM

[75] Inventors: David C. Look; Philip D. Mumford, both of Dayton, Ohio

[73] Assignee: The United States of America as represented by the Secretary of the Air Force, Washington, D.C.

[21] Appl. No.: 763,736

[22] Filed: Sep. 23, 1991

[51] Int. Cl.$^5$ .............. G01R 31/00; G01R 19/00
[52] U.S. Cl. .............. 324/158 R; 324/73.1; 324/719; 324/226; 437/8
[58] Field of Search ............ 324/158 R, 73.1, 202, 324/226, 228, 251, 262, 501, 537, 719; 437/8

[56] References Cited

U.S. PATENT DOCUMENTS

| | | | |
|---|---|---|---|
| 2,987,669 | 6/1961 | Kallmann | 324/45 |
| 2,988,650 | 6/1961 | Weiss | 307/88.5 |
| 3,160,762 | 12/1964 | Steele et al. | 307/88.5 |
| 4,099,238 | 7/1978 | Suzuki | 364/481 |
| 4,190,799 | 2/1980 | Miller et al. | 324/158 D |
| 4,346,348 | 8/1982 | Bartoli et al. | 324/158 D |
| 4,488,112 | 12/1984 | Thompson et al. | 324/202 |
| 4,806,858 | 2/1989 | Elbicki | 324/226 |
| 4,816,755 | 3/1989 | Look et al. | 324/158 R |
| 4,857,839 | 8/1989 | Look et al. | 324/158 R |

OTHER PUBLICATIONS

The Hall Effect and Magnetoresistance, Chapter 1, D. C. Look, Electrical Characterization of GaAs Mat. & Dev. (1989).
On-Wafer Hall-Effect Measurement System, P. D. Mumford & D. C. Look, pub. acc. Feb. 11, 1991.

*Primary Examiner*—Vinh Nguyen
*Attorney, Agent, or Firm*—Thomas L. Kindert; Donald J. Singer

[57] ABSTRACT

A non-destructive measurement system for producing whole wafer maps of sheet Hall concentration and Hall mobility in a GaAs wafer. The wafer need only have van der Pauw patterns available for the wafer measurements to be made. The measurement system includes an automatic test prober apparatus modified to incorporate a powerful permanent magnet providing a magnetic field to produce a Hall effect in the GaAs wafer. A parametric measurement system coupled through test probes to the van der Pauw patterns is programmed to measure sheet resistivity, Hall voltage and magnetic field strength, from which are derived values of sheet Hall concentration and mobility that are stored and mapped.

8 Claims, 4 Drawing Sheets

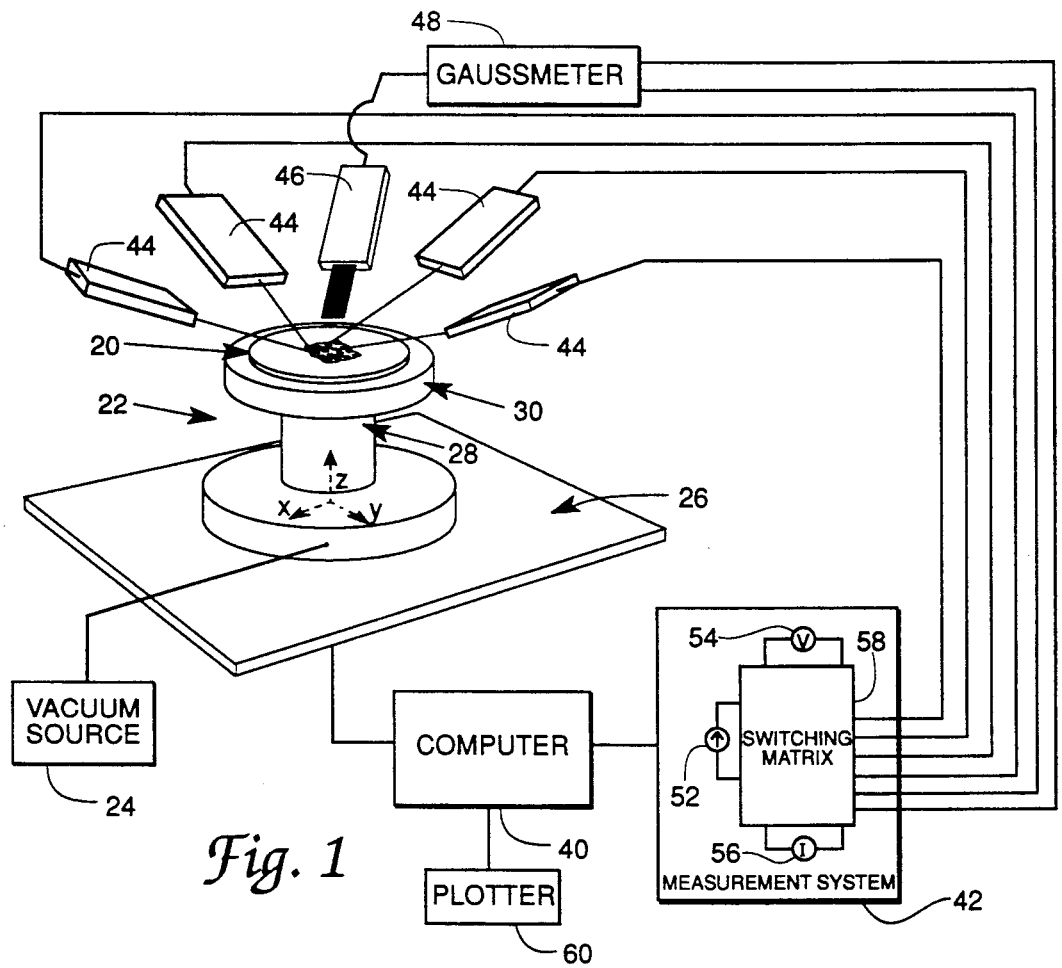
Fig. 1
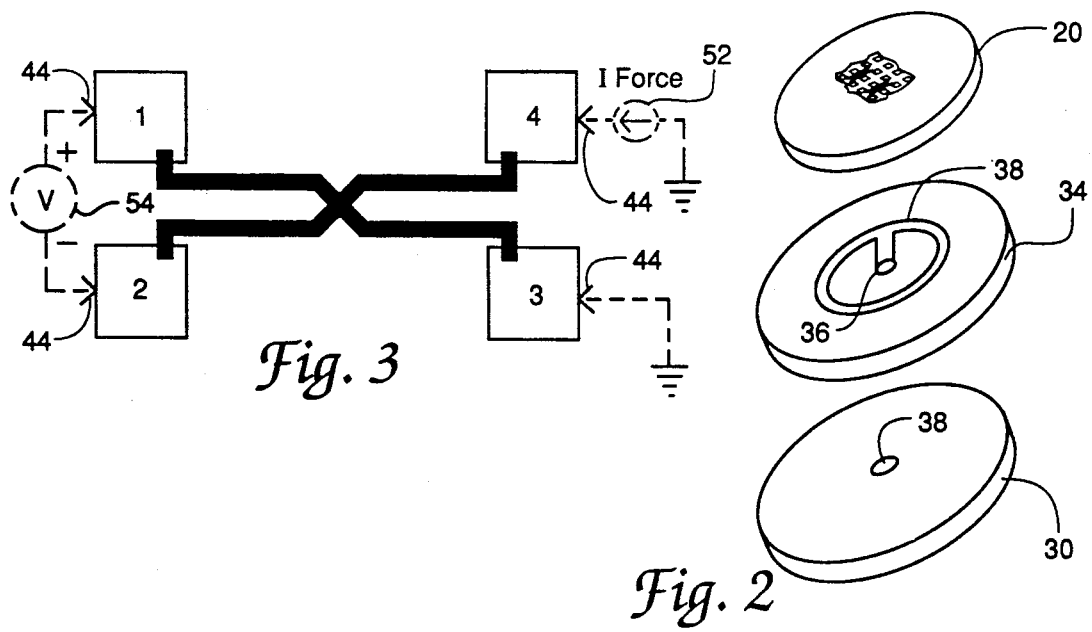
Fig. 3
Fig. 2

5,150,042

ON-WAFER HALL-EFFECT MEASUREMENT SYSTEM

RIGHTS OF THE GOVERNMENT

The invention described herein may be manufactured and used by or for the Government of the United States for all governmental purposes without the payment of any royalty.

BACKGROUND OF THE INVENTION

The invention relates non-destructive characterization of GaAs wafers and more specifically to a system for measuring carrier mobility and carrier concentration from on-wafer Hall-effect measurements of a patterned GaAs wafer during the fabrication sequence.

Resistivity ($\rho$) mobility ($\mu$), and carrier concentration (n) are acknowledged figures of merit for semiconductor materials. On a large wafer (e.g., 2 or 3 inches round, GaAs wafers), $\rho$, $\mu$ and n can vary as a function of position, and it is important to ascertain these variations before committing the wafer to full device fabrication. A relatively common modern procedure is to carry out automated resistivity mapping after ohmic contacts have been formed on the wafer, but before the rest of the processing has been completed. The resistivity mapping normally makes use of a dense set of van der Pauw patterns, which require only ohmic contacts. It is generally acknowledged that the parameters $\mu$ and n would be much more useful, but up to now their attainment using current test equipment has required cutting up the wafer in order to get enough pieces to fit between the pole pieces of a magnet. The present invention makes it possible to get such measurements without cutting up the wafer.

Measurements of conducting layer mobility and carrier concentration are important and useful parameters in the design and modeling of field effect devices. Designers are able to use this information to more effectively model device designs for improved performance and the information can provide a guide to process engineers for modification aimed at improved process uniformity. Methods which rely on C-V and I-V measurements of test structures have been developed to obtain carrier mobility and concentration. These methods require careful attention to measurement technique and are difficult to accurately implement.

SUMMARY OF THE INVENTION

An object of the invention is to provide a system capable of making on-wafer, Hall-effect measurements of a patterned GaAs wafer.

It is another object of the invention to provide an automated non-destructive measurement system for producing dense, whole wafer maps of sheet Hall concentration and Hall mobility in a GaAs wafer without damaging the wafer.

According to the invention, a non-destructive measurement system is disclosed for producing whole wafer maps of sheet Hall concentration and Hall mobility in a GaAs wafer. The wafer need only have van der Pauw patterns available for on-wafer measurement to be made. According to the preferred embodiment the GaAs wafer has a plurality of test sites on the surface thereof each having a set of ohmic contacts connected to the van der Pauw pattern. The pattern may be in the shape of a Greek cross or other shapes as are known in the art, and is repeated on the wafer approximately every 2.0×2.5 mm to obtain the density of measurement desired.

The measurement system includes an automatic prober test apparatus modified to incorporate a powerful permanent magnet to provide a magnetic field required to produce a Hall effect in the GaAs wafer.

The GaAs wafer is mounted in the automatic prober test apparatus and is movable relative to a set of test probes to bring the ohmic contacts into electrical contact therewith. A parametric measurement system is connected to the test probes and is programmed to measure the average sheet resistance on the van der Pauw pattern through a series of iterations. Hall voltage is measured in a similar manner as well as the magnetic field strength of the permanent magnet at the test site. From the measured values of sheet resistance, Hall voltage and magnetic field strength, the sheet Hall concentration and Hall mobility values are calculated. Resultant data is stored in a data file from which whole wafer maps of carrier concentration and mobility may be generated.

Other features and advantages of the invention will be apparent from the following description, drawings, and claims, which show and describe an embodiment of the invention.

BRIEF DESCRIPTION OF THE DRAWINGS

FIG. 1 is a schematic view of a system for achieving non-destructive on-wafer sheet Hall concentration and mobility measurements of a van der Pauw patterned GaAs wafer;

FIG. 2 is a schematic view of a preferred embodiment of a suction operated mounting arrangement for holding the GaAs wafer to the permanent magnet in the measurement system of the invention;

FIG. 3 is a schematic view of a Greek cross van der Pauw test pattern;

DETAILED DESCRIPTION

Figure 4A:
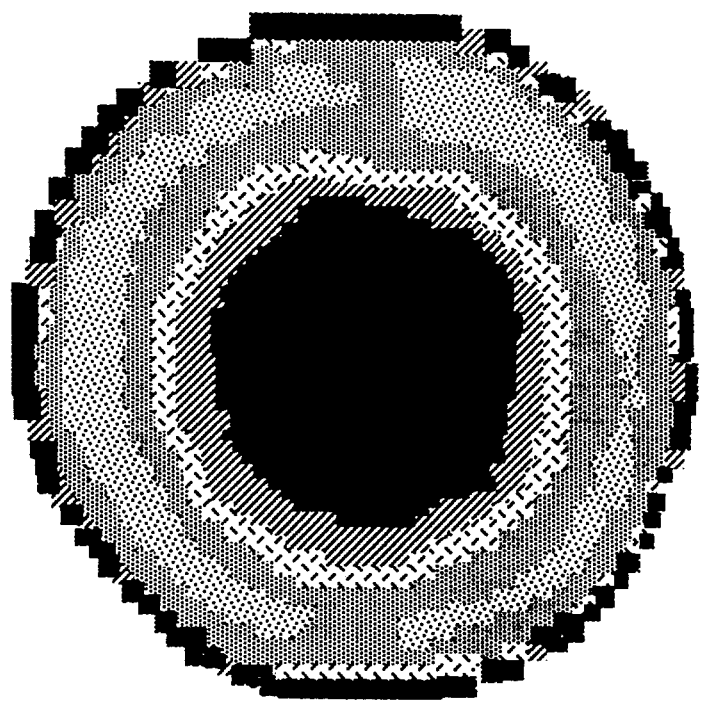
FIGS. 4 a-b are a gray-scale map and histogram showing magnetic field strength at 1 mm resolution at the same physical location as the van der Pauw test patterns.

FIG. 1 illustrates the on-wafer Hall-effect measurement system according to the invention. A GaAs wafer 20 is mounted in a prober test apparatus 22 such as an Electroglas Model 2001X semi-automatic prober manufactured by Electroglas Inc., 2901 Coronado Drive, Santa Clara, Calif. 95054. The automatic prober test apparatus 22 includes a support table 26 on which a chuck 28 is movable in X, Y and Z directions. The automatic prober test apparatus 22 is modified to include a flat permanent magnet 30 on chuck 28 beneath the GaAs wafer 20 being tested. The magnet 30 is preferably made of samarium cobalt having a field strength in the range of 1–2 kilogauss. The magnet 30 has a diameter at least the size of the GaAs wafer 20 and a flat upper surface adapted for mounting the wafer in the automatic prober test apparatus 22.

The GaAs wafer 20 may be secured to the magnet 30 by suitable means such as vacuum source 24. In a preferred embodiment of the invention shown in FIG. 2, vacuum from source 24 is supplied through a hole 32 in magnet 30. A plate 34 adapted to be positioned on magnet 30 has an axially aligned hole 36 coupled to an annular grooved pathway 38 for providing vacuum to the bottom surface of the GaAs wafer 20.

The GaAs wafer 20 is provided with an array of test patterns indicated in FIG. 1 used for making resistivity measurements. The test pattern preferably comprises a Greek cross shape, as shown in FIG. 3, however, those skilled in the art will appreciate that other patterns such as a square, circular, or clover leaf configuration may also be used. The density of the test patterns may vary depending on the resolution desired. In the invention described herein, the pattern is repeated every $2.0 \times 2.5$ mm on the GaAs wafer 20.

The automatic probe test apparatus 22 is connected to a programmable computer 40 and a parametric measurement system 42 such as a Keithley model 450 measurement system manufactured by Keithley Instruments, 30500 Bainbridge Road, Cleveland, Ohio 44139. The computer 40 controls the automatic prober test apparatus 22 to move the chuck 28 to a particular X-Y coordinate test site and then moves the chuck 28 in the Z direction bringing the GaAs wafer 20 in contact with a set of test probes 44. The parametric measurement system 42 includes integral source of current 52, voltage and current measuring instruments 54 and 56, respectively and a switching matrix 58 controlled by computer 40 to interconnect the source and instruments to probes 44.

The sheet resistance and sheet Hall coefficient of the GaAs conducting layer are obtained from van der Pauw resistance and Hall-effect measurements as described in D. C. Look, "Electrical Characterization of GaAs Material And Devices," (Wiley, New York, 1989). Calculation of the sheet resistance ($\rho_s$), sheet Hall concentration ($R_{Hs}$), and Hall mobility ($\mu_H$) are made using the equations shown below.

$$\rho_s = \rho/t = \pi/\ln 2 \times (R_{43,12} + R_{23,14})/2 \; \Omega/square \quad (1)$$

$$R_{Hs} = R_H/t = 10^8/B \times (|R_{42,31}| + |R_{13,24}|)/2 \; cm^2/C \quad (2)$$

$$\mu_H = (R_H/t)/(\rho/t) = R_{Hs}/\rho_s \; cm^2/V.s \quad (3)$$

With reference to the test pattern shown in FIG. 3 and the above equations, the numbered subscripts for resistance ($R_{43,12}$) represent resistance measured with current flowing from connection 4 to 3 and voltage measured between connections 1 and 2. Magnetic field strength (B) for the magnet 30 is measured with by a probe 46 connected to a gaussmeter 48 and stored in memory in computer 40 for each test pattern location. It would also be possible to map the field of the magnet once into memory for routine testing rather than each time.

A computer program for testing a quarter wafer sample is incorporated herein as Appendix A. The program drives the parametric measurement system 42 to measure the sheet resistance $\rho_s$ on the van der Pauw pattern of FIG. 3. Measurement of voltages is made by connecting a voltmeter to ohmic contacts 1 and 2, connecting contact 3 to ground, and connecting a current source to contact 4. Maximum voltage on the current source is limited to VLIM and the resultant response is integrated over 167 MS. A linearity check may be performed by doubling the current to make sure the measurement is in the linear range of resistance. This measurement is stored for calculation of linearity performed later. The process is then repeated by switching the current and voltmeter connections to the contacts through up to four different iterations. Sheet resistance ($\rho_s$) is then calculated according to equation 1 above using the average of the resistances measured.

The computer program then directs the parametric measurement system 42 to measure Hall voltages using a similar arrangement with common current flowing and counter clockwise rotation though four configurations around the test pattern. The average of the Hall voltages is taken, and together with the magnetic field strength and sheet resistance thickness value, sheet Hall concentration ($R_{Hs}$) and Hall mobility ($\mu_H$) parameters may be calculated from equations 2 and 3 above.

The sheet Hall electron concentration ($n_s$) in electrons/cm$^2$ may be calculated from the following equation $$n_s = 1/eR_{Hs} \quad (4)$$

where $e = 1.602 \times 10^{-19}$ coulombs/electron.

The results are downloaded to a data file from which maps of magnetic field strength (FIG. 4), sheet Hall electron concentration (FIG. 5) and Hall mobility (FIG. 6) may be plotted by a conventional plotter 60.

Figure 4B:
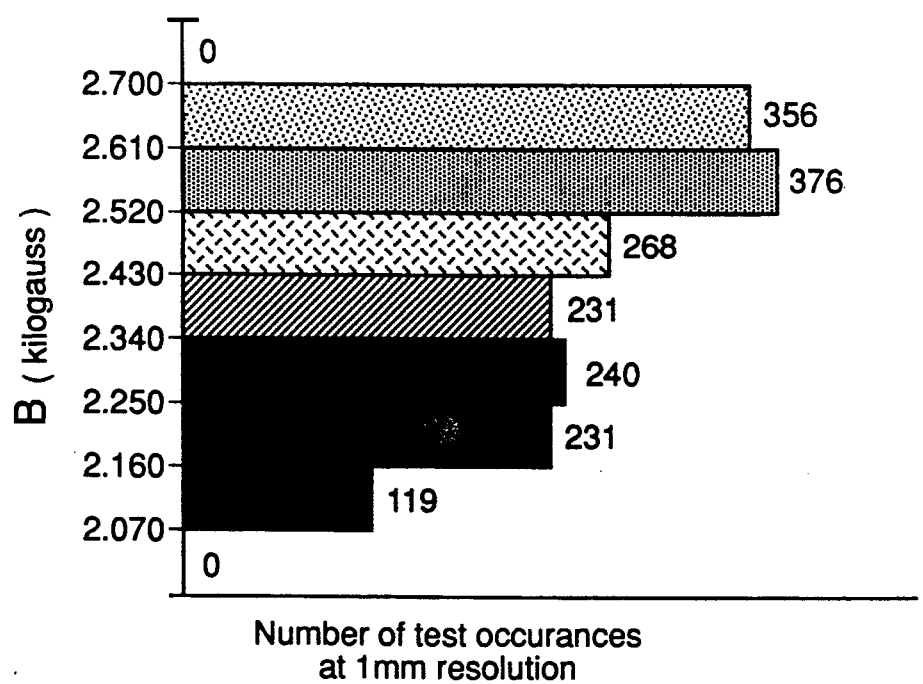
Figure 5A:
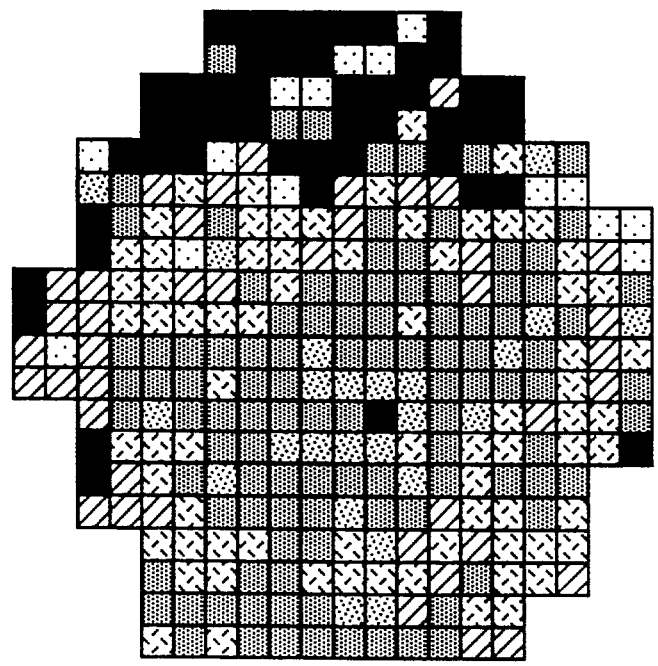
FIGS. 5 a-b gray-scale map and histogram showing sheet Hall concentration as measured at individual test sites on the GaAs wafer.
Figure 5B:
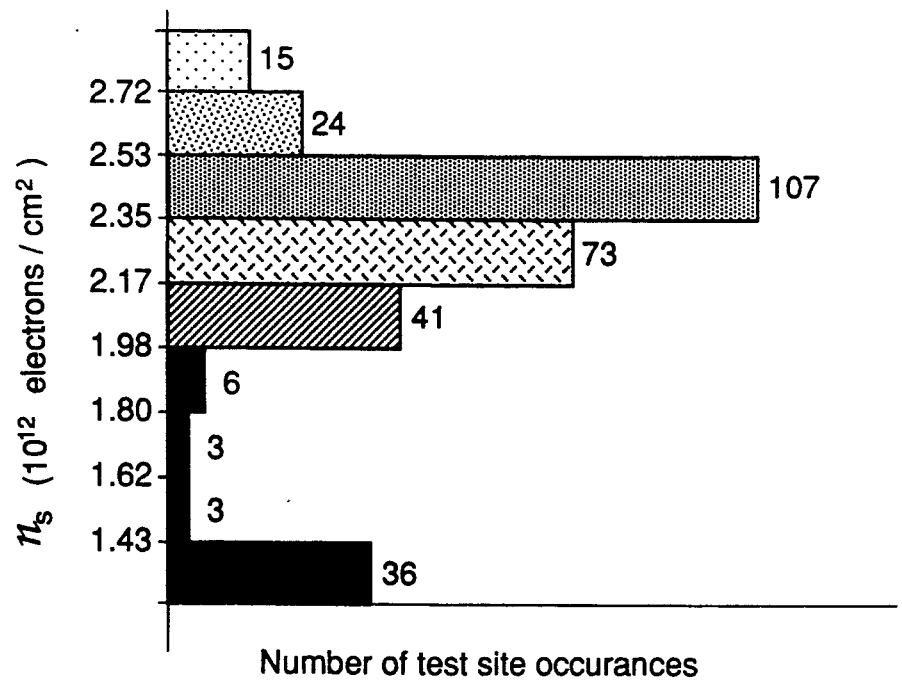
Figure 6A:
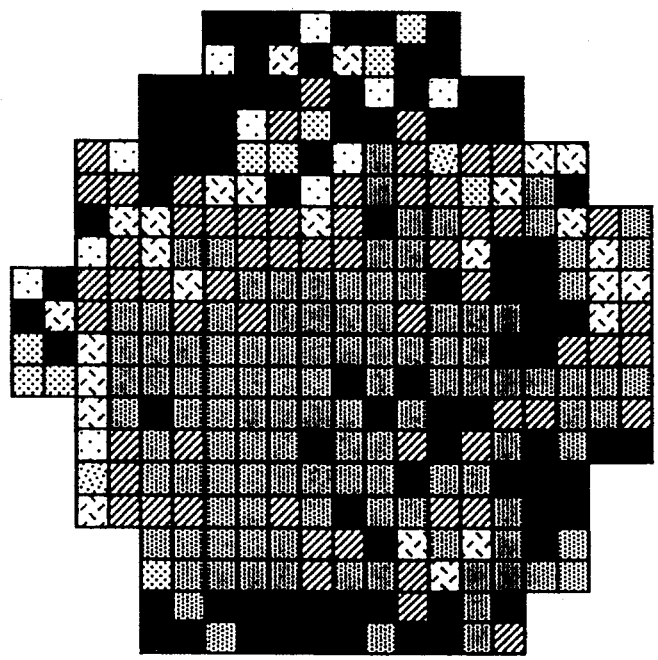
FIGS. 6 a-b are a gray-scale map and histogram showing Hall mobility as measured at individual test sites on the GaAs wafer.
Figure 6B:
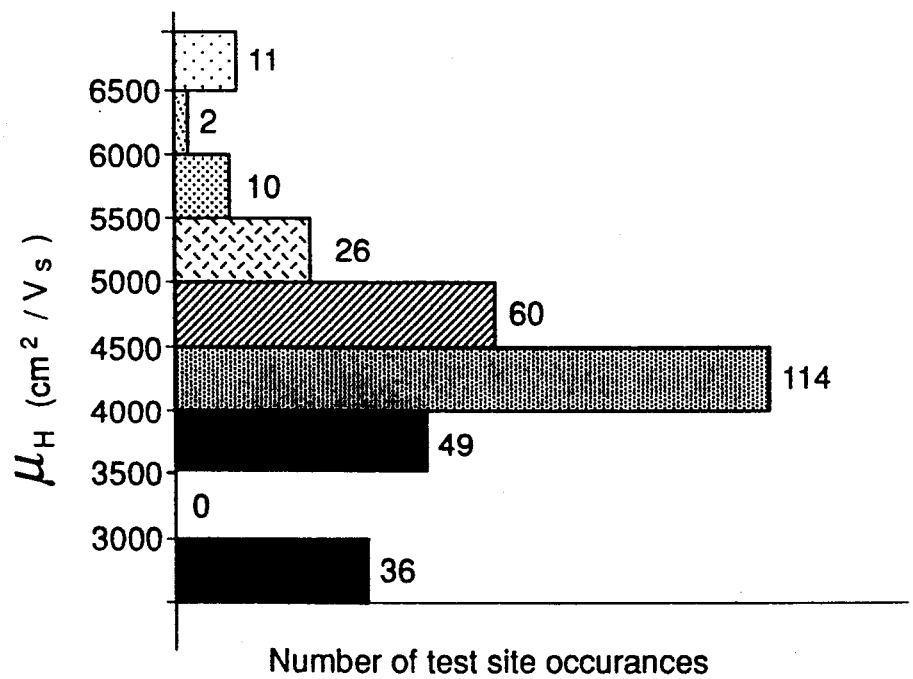

The magnet 30 was measured initially with 1 mm resolution to ascertain the uniformity of the field strength and its positional dependence of magnetic field strength producing nearly concentric annular rings relative to the center of the magnet. As seen in FIG. 4, the center of the magnet has the lowest value of field strength with the area near the edge having the highest. The field strength varied $\pm 10\%$ over most of the magnet surface. A 2 inch ion implanted GaAs wafer was used to demonstrate the invention. The test pattern was probed using the apparatus of FIG. 1. Total test time for 308 test sites was 64 minutes. This time included error checking routines for linearity of the measurement, a check for non-ohmic contacts, and use of an external microvoltmeter for very accurate measurement of resistance structures. The test time could be considerably reduced by using the parametric measurement system's internal voltmeter, commonly employed for field effect transistor (FET) measurements to measure the sheet resistance pattern. A map of the measured wafer sheet-Hall electron concentration and Hall mobility are shown in FIGS. 5 and 6.

A physics based transistor process simulation program, GATES (Gallium Arsenide Transistor Engineering Simulator), was used for comparison of predicted versus measured Hall quantities. The wafer was implanted with a dose of Si at $5 \times 10^{12}$ electrons/cm$^2$ at 100 keV. The simulation was run with implant activation adjusted to provide agreement with the measured active layer sheet resistance from the Greek cross pattern and the unrecessed transistor saturation current as measured on a 200 $\mu$m single finger FET. The mobility and sheet carrier concentration were deduced from these data. The results of this simulation indicated an implant activation between 73% and 76% with an average sheet concentration of $2.52 \times 10^{12}$ electrons/cm$^2$, and average active layer mobility of 4500 cm$^2$/V.s. These results agree quite favorably with the mean sheet-Hall concentration of $2.3 \times 10^{12}$ electrons/cm$^2$, and mean Hall mobility of 4454 cm$^2$/V.s derived from the data in FIGS. 5 and 6. The Hall measurements are, of course, more accurate since they constitute a more direct measurement of mobility and carrier concentration.

Thus, while preferred features of the invention are described and illustrated herein, it is understood that changes and variations may be made as by those skilled in the art without departing from the spirit and scope of the invention.

APPENDIX A
Program Listing for On-Wafer Hall Measurement

```
        PROGRAM nvdpwlhall
C
C Modified           for 1st quadrant of g2-991.
C
C Program for measurement of resistivity and hall mobility
C using a 2" flat magnet and the Task 4e Van der Pauw structure.
C Lower left corner of each probe subsite is specified.
C To use test station 2, offset probe touchdown DOWN by one row.
C
C    Probe test pins:      Test Station 1  Test Station 2
C         Left                  18              24
C         Top                   16              23
C         Right                 12              19
C         Bottom                10              17
C
C Bottom and Right test connections are reversed for Hall measurement C Define System instruments :

INCLUDE '(KI$LPTDEF)/NOLIST'

C Define Prober calls      :

INCLUDE '(KI$PRBDEF)/NOLIST'

C Declare program variables :

INCLUDE '(KI$KDMKEY)/NOLIST'   ! Defines keys in KDM data base
                                       !  existing lot-data file
        INTEGER BINNUM                 ! Bin number for the wafer
        INTEGER ERROR                  ! Error return
        INTEGER*4 TOTWAF               ! Total number of wafers tested
        INTEGER*4 TOTSIT               ! Total number of sites tested
        INTEGER*4 DTIME                ! Delay time for measurement stabilization
        PARAMETER (DTIME = .01)        ! Set delay time to 10 mS
        INTEGER NUMWAF                 ! Total number of wafers per lot
        INTEGER NUMBER                 ! Test station returned as value
        BYTE STRING(2)                 ! Test station returned as asciz
        BYTE KBDBUF(20)                ! Keyboard buffer
        INTEGER IS                     ! Loop counter for sites
        INTEGER I,J,K,M                ! All-purpose integer
        integer compcol,comprow        ! packed row,col designators
        INTEGER L,T,B,R                ! PAD PIN DESIGNATORS
        REAL REM                       ! Variable for col array
        REAL VLIM, IFORC               ! Voltage Limit and Current Force
```

```
C The following vars are for prober control   :

INTEGER IOK                       ! Var for ready bit return
      INTEGER IROW                      ! Var for row id storage
```

Program Listing for On-Wafer Hall Measurement

```
      INTEGER ICOL                      ! Var for column id storage
      INTEGER IREADY                    ! Var for prober ready bit return
      INTEGER ICHUCK                    ! Var for chuck status bit return
      INTEGER IMOD                      ! Var for mode bit return
      INTEGER IMIS                      ! Var for misc. bit return C Parameter Declarations   :

REAL RPAR(2)                      ! Real parameters

C Function Result Declarations :

REAL RS,SLOPE,Y_INTER,R_FACTOR    ! Real function results
      REAL RHB,MUXB
      REAL I1, I2                       ! Current force variables
      REAL V1A,V1B,V1C                  ! Measured voltage variables
      REAL V2A,V2B,V2C
      REAL V3A,V3B,V3C
      REAL V4A,V4B,V4C
      REAL VAS,VBS,VCS
      REAL XSIZE                        ! Die Size in X-direction (mm)
      PARAMETER (XSIZE =  4.500)
      REAL YSIZE                        ! Die Size in Y-direction (mm)
      PARAMETER (YSIZE =  4.000)
      INTEGER UNITS                     ! Prober Units 0-English, 1-Metric
      PARAMETER (UNITS =  1)
      INTEGER NUMSIT                    ! Number of sites to probe
      PARAMETER (NUMSIT = 1)
      INTEGER SNUMSIT                   ! Number of subsites to probe
      PARAMETER (SNUMSIT = 5)
      INTEGER ROW(NUMSIT)
      INTEGER COL(NUMSIT)
      INTEGER SROW(SNUMSIT)
      INTEGER SCOL(SNUMSIT)
      INTEGER SRC(SNUMSIT)
      CHARACTER*10   FILENAME
      CHARACTER*1    TAB,GFLAG
      EXTERNAL SATPEX                   ! Defines subroutine for CALL USEREX C  Probe Sites c  Row, Col for wafer g2-991 quadrant 1 c       Data Row/1,1,1,1,
c       1       2,2,2,
c       1       3,3,3,
c       1       4,4/ c       Data Col/1,2,3,4,
c       1       3,2,1,
```

Program Listing for On-Wafer Hall Measurement

```
c      1    1,2,3,
c      1    2,1/ c  Single Reticle Probing

Data Row/1/

Data Col/1/

Data Srow/0,0,2000,2000,0/

Data Scol/0,2250,2250,0,0/

C BUILD SUBSITE COUNTER MATRIX

DO I=1,SNUMSIT
         SRC(I)=I
       ENDDO

C Define user exit routine name      :

CALL USEREX( SATPEX )  ! SATPEX will be executed anytime this program

C Time to determine which test station this program was executed from   :

TAB=CHAR(9)
       CALL GETSTA ( NUMBER, STRING )
       CALL TSTSEL ( NUMBER )

IF (NUMBER.EQ.1)THEN
         L=18
         T=16
         B=12
         R=10
       ELSE
         TYPE *, 'OFFSET PROBES DOWN 1 PROBE PAD ROW FOR TEST STATION 2'
         L=24
         T=23
         B=19
         R=17
       ENDIF

TYPE *,'What is the file name? '
       READ (*,12)FILENAME
12     FORMAT(A10)
       OPEN(UNIT=11,STATUS='NEW',FILE= FILENAME)

100    CONTINUE                  ! Start of lot loop

TOTWAF = 0                ! Init number of wafers
```

Program Listing for On-Wafer Hall Measurement

```
       TOTSIT = 0                ! Init number of sites
```

C Initialize prober for random access learn mode (6)       :

CALL PRINIT (6, XSIZE, YSIZE, COL(1), ROW(1), UNITS )·

CALL PRLEARN (1, NUMSIT, COL, ROW)        ! Load learn list

CALL PRSSLEARN(SNUMSIT, SCOL, SROW, SRC)

TYPE *,'* Press FIRST (AT DIE LOCATION #1), THEN AUTOPROBE *'

CALL PRWAIT

TYPE 145
145    FORMAT( $,' Press RETURN to continue')
       ACCEPT *

C Start the implied site testing loop   :

write(11,14) 'X',tab,'Y',tab,
     1      'Rs@',tab,'Rs_m@',tab,'Rs_b@',tab,'Rh@',tab,'MU*B@'
14     format(1x,a1,a1,a1,5(a1,a5))

DO IS = 1,NUMSIT
         DO J = 1,SNUMSIT
           TOTSIT = TOTSIT + 1    ! Count number of sites
           compcol =(col(is)-1)*2+scol(j)/2250       ! COMPRESSED ARRAY
           comprow =(row(is)-1)*2+srow(j)/2000   ! COMPRESSED ARRAY C    VAN DER PAUW LAYOUT
C  L_____       _____ T
C         \       /                  $$\rho = \frac{\pi \cdot t}{\ln 2} \cdot \frac{R1 + R2 + R3 + R4}{4}$$
C          \     /
C           \   /
C            \ /
C             X                      $$RS = \rho/t$$
C            / \
C           /   \                    $$Rh = \frac{1E8 \cdot t}{B} \cdot \frac{|RH1|+|RH2|+|RH3|+|RH4|}{4}$$
C          /     \
C         /       \
C  B ____/         \____ R          $$RHB = Rh \cdot B/t$$
C
C                                    $$mu = \frac{Rh}{\rho} = \frac{Rh/t}{\rho/t} = \frac{1}{B} \cdot \frac{Rh \cdot B/t}{\rho/t} = \frac{1}{B} \cdot \frac{RHB}{RS}$$
C
C                                    $$MUXB = RHB/RS = mu \cdot B$$
C
C MEASUREMENT OF SHEET RESISTANCE ON VAN DER PAUW PATTERN

Program Listing for On-Wafer Hall Measurement

IFORC=0.001
       VLIM=40.0

```
C MEASURE FIRST ARM
        CALL CONPTH(1, VMTR1L, B)
        CALL CONPTH(2, VMTR1, L)
        CALL CONPIN(R, GND, VIMS1L)
        CALL CONPIN(VIMS1, T)
        CALL LIMITV(VIMS1, VLIM)
        CALL FORCEI( VIMS1, IFORC)
        CALL DELAY(DTIME)
        CALL INTGV(VMTR1, V1A)
        CALL EXECUT

C DOUBLE CURRENT FOR LINEARITY CHECK
        CALL CONPTH(1, VMTR1L, B)
        CALL CONPTH(2, VMTR1, L)
        CALL CONPIN(R, GND, VIMS1L)
        CALL CONPIN(VIMS1, T)
        CALL LIMITV(VIMS1, VLIM)
        CALL FORCEI( VIMS1, 2*IFORC)
        CALL DELAY(DTIME)
        CALL INTGV(VMTR1, V1B)
        CALL EXECUT write(*,5) compcol, tab, comprow, tab, v1a, tab, v1b
5       format(1x,I12,a1,I12,2(a1,E12.5))

C ROTATE FOR MEASUREMENT IN SECOND ARM
        CALL CONPTH(1, VMTR1L, L)
        CALL CONPTH(2, VMTR1, T)
        CALL CONPIN(B, GND, VIMS1L)
        CALL CONPIN(VIMS1, R)
        CALL LIMITV(VIMS1, VLIM)
        CALL FORCEI( VIMS1, IFORC)
        CALL DELAY(DTIME)
        CALL INTGV(VMTR1, V2A)
        CALL EXECUT

C DOUBLE CURRENT FOR LINEARITY CHECK IN SECOND ARM
        CALL CONPTH(1, VMTR1L, L)
        CALL CONPTH(2, VMTR1, T)
        CALL CONPIN(B, GND, VIMS1L)
        CALL CONPIN(VIMS1, R)
        CALL LIMITV(VIMS1, VLIM)
        CALL FORCEI( VIMS1, 2*IFORC)
        CALL DELAY(DTIME)
        CALL INTGV(VMTR1, V2B)
        CALL EXECUT
```

Program Listing for On-Wafer Hall Measurement

```
        write(*,6) TAB, tab, TAB, TAB, v2a, tab, v2b
6       format(1x,a1,A1,A1,2(a1,E12.5))

C ROTATE FOR MEASUREMENT IN THIRD ARM
        CALL CONPTH(1, VMTR1L, T)
        CALL CONPTH(2, VMTR1, R)
        CALL CONPIN(L, GND, VIMS1L)
```

```
        CALL CONPIN(VIMS1, B)
        CALL LIMITV(VIMS1, VLIM)
        CALL FORCEI( VIMS1, IFORC)
        CALL DELAY(DTIME)
        CALL INTGV(VMTR1, V3A)
        CALL EXECUT

C DOUBLE CURRENT FOR LINEARITY CHECK IN THIRD ARM
        CALL CONPTH(1, VMTR1L, T)
        CALL CONPTH(2, VMTR1, R)
        CALL CONPIN(L, GND, VIMS1L)
        CALL CONPIN(VIMS1, B)
        CALL LIMITV(VIMS1, VLIM)
        CALL FORCEI( VIMS1, 2*IFORC)
        CALL DELAY(DTIME)
        CALL INTGV(VMTR1, V3B)
        CALL EXECUT write(*,6) TAB, tab, TAB, TAB, v3a, tab, v3b C ROTATE FOR MEASUREMENT IN FOURTH ARM
        CALL CONPTH(1, VMTR1L, R)
        CALL CONPTH(2, VMTR1, B)
        CALL CONPIN(T, GND, VIMS1L)
        CALL CONPIN(VIMS1, L)
        CALL LIMITV(VIMS1, VLIM)
        CALL FORCEI( VIMS1, IFORC)
        CALL DELAY(DTIME)
        CALL INTGV(VMTR1, V4A)
        CALL EXECUT C DOUBLE CURRENT FOR LINEARITY CHECK IN FOURTH ARM
        CALL CONPTH(1, VMTR1L, R)
        CALL CONPTH(2, VMTR1, B)
        CALL CONPIN(T, GND, VIMS1L)
        CALL CONPIN(VIMS1, L)
        CALL LIMITV(VIMS1, VLIM)
        CALL FORCEI( VIMS1, 2*IFORC)
        CALL DELAY(DTIME)
        CALL INTGV(VMTR1, V4B)
        CALL EXECUT
```

Program Listing for On-Wafer Hall Measurement

```
        write(*,6) TAB, tab, TAB, TAB, v4a, tab, v4b

C FOR A LINEAR RESISTANCE,
C
C       VB-    /
C         |   /             SLOPE = RISE / RUN
C         |  /                    = (VB - VA) / (I2 - I1)
C         | /
C       VA-  /              INTERCEPT = Y - MX
C         | /                         = VA - SLOPE * I1
C         |/                          = VA - I1 * (VB - VA) / (I2 - I1)
C         ------|-----|-----|-----
C        /|    I1    I2
C       / |
```

```
C
C CALCULATE MEASUREMENTS
        VAS = .25 * (V1A + V2A + V3A + V4A)
        VBS = .25 * (V1B + V2B + V3B + V4B)
        WRITE(*,6) TAB, TAB, TAB, TAB, VAS, TAB, VBS

C X AXIS IS CURRENT FORCE, Y AXIS IS VOLTAGE SENSE
C Slope = rise/run = Delta Voltage (average(VBS - VAS)) / Delta Current(1mA)
C      = {(VBS) - (VAS)} / IFORC

SLOPE = (VBS - VAS) / IFORC

C y = mx + b, So, b = y - mx; Therefore, with x = 1mA,
C Y axis intercept = VAS - slope * IFORC
C                  = VAS - IFORC * (VBS - VAS) / IFORC
C                  = VAS - (VBS - VAS)
C                  = 2 * VAS - VBS

Y_INTER = 2 * VAS - VBS

C Sheet Resistance
C RS = pi/ln2 * average resistances
C    = pi/ln2 * average VA's / IFORC
C    = pi/ln2 * VAS / IFORC
C    = 4.532360142 * VAS / IFORC

RS = 4.532360142 * VAS / IFORC

C MEASURE HALL VOLTAGE with common current forcing.  CCW rotation

C FIRST ARM
        CALL CONPTH(1, VMTR1L, L)
        CALL CONPTH(2, VMTR1, R)
        CALL CONPIN(B, GND, VIMS1L)
        CALL CONPIN(VIMS1, T)
```

Program Listing for On-Wafer Hall Measurement

```
        CALL LIMITV(VIMS1, VLIM)
        CALL FORCEI( VIMS1, IFORC)
        CALL DELAY(DTIME)
        CALL INTGV(VMTR1, V1A)
        CALL EXECUT

WRITE(*,7) V1A
7       FORMAT(1X,E12.5)

C ROTATE AND MEASURE IN SECOND ARM
        CALL CONPTH(1, VMTR1L, B)
        CALL CONPTH(2, VMTR1, T)
        CALL CONPIN(R, GND, VIMS1L)
        CALL CONPIN(VIMS1, L)
        CALL LIMITV(VIMS1, VLIM)
        CALL FORCEI( VIMS1, IFORC)
        CALL DELAY(DTIME)
        CALL INTGV(VMTR1, V2A)
        CALL EXECUT
```

```
        WRITE(*,7) V2A

C ROTATE AND MEASURE IN THIRD ARM
        CALL CONPTH(1, VMTR1L, R)
        CALL CONPTH(2, VMTR1, L)
        CALL CONPIN(T, GND, VIMS1L)
        CALL CONPIN(VIMS1, B)
        CALL LIMITV(VIMS1, VLIM)
        CALL FORCEI( VIMS1, IFORC)
        CALL DELAY(DTIME)
        CALL INTGV(VMTR1, V3A)
        CALL EXECUT

WRITE(*,7) V3A

C ROTATE AND MEASURE IN FOURTH ARM
        CALL CONPTH(1, VMTR1L, T)
        CALL CONPTH(2, VMTR1, B)
        CALL CONPIN(L, GND, VIMS1L)
        CALL CONPIN(VIMS1, R)
        CALL LIMITV(VIMS1, VLIM)
        CALL FORCEI( VIMS1, IFORC)
        CALL DELAY(DTIME)
        CALL INTGV(VMTR1, V4A)
        CALL EXECUT

WRITE(*,7) V4A

VAS = .25 * (ABS(V1A) + ABS(V2A) + ABS(V3A) + ABS(V4A))
        WRITE(*,7) VAS
```

Program Listing for On-Wafer Hall Measurement

```
C CALCULATE HALL COEFICIENT * KILOGAUSS / THICKNESS VALUE

RHB = 1E8 * VAS / IFORC

C CALCULATE MOBILITY * KILOGAUSS PRODUCT

MUXB = RHB/RS

C WRITE THE DATA 899 write(11,4) compcol,tab,comprow,tab,
   1      RS,TAB,SLOPE,TAB,Y_INTER,TAB,RHB,TAB,MUXB
   4  format(1x,I2,a1,I2,5(a1,E12.5))

IOK = PRSSMOVNXT (0)      ! move prober to next subsite

ENDDO

ENDDO

CLOSE(11)
```

```
      CALL LIB$SPAWN( 'MAIL [mumford]MSSAGE1.txt MUMFORD ' )

type *,'MEASURE GAUSS STRENGTH AT TEST SITES <Y>/N ? '
      READ(*,'(A1)')GFLAG IF ((GFLAG .EQ. 'N') .OR. (GFLAG .EQ. 'n')) THEN
            GOTO 999
      ENDIF TYPE *,'SET UP GAUSS PROBE FOR MEASUREMENT'
      TYPE *,'When Gauss probe is in place, Press AUTOPROBE on prober,'
      TYPE 145
      ACCEPT *

OPEN(UNIT=12,STATUS='NEW',FILE='GFOR'//FILENAME)

C Start the implied site testing loop FOR MAGNETIC FIELD STRENGTH:

write(11,15) 'X',TAB,'Y',TAB,'KILOGAUSS'
15    format(1x,a1,a1,a1,A1,a9)

DO IS = 1,NUMSIT

DO J = 1,SNUMSIT

TOTSIT = TOTSIT + 1    ! Count number of sites
```

Program Listing for On-Wafer Hall Measurement

```
          compcol =(col(is)-1)*2+scol(j)/2250    ! COMPRESSED ARRAY
          comprow =(row(is)-1)*2+srow(j)/2000    ! COMPRESSED ARRAY CALL CONPIN(1,ViMs1L,GND)
          CALL CONPIN(2,ViMs1)
          CALL INTGV (ViMs1,V)
          CALL EXECUT v = v*10 write(11,16) compcol,tab,comprow,tab,v
16        format(1x,I2,a1,I2,a1,E12.5)

IOK = PRSSMOVNXT (0)          ! move prober to next subsite

ENDDO

ENDDO

CLOSE(12)

999   CALL LIB$SPAWN( 'MAIL [mumford]MSSAGE.txt MUMFORD ' )

CALL EXIT

END
```

We claim:

1. A nondestructive measurement system for making on-wafer Hall effect measurements of a patterned GaAs wafer, comprising:

a support fixture mounting said GaAs wafer, said GaAs wafer having on a surface thereof a plurality of test sites each comprising a set of ohmic contacts connected to a van der Pauw pattern;

magnet means mounted on said support fixture for generating a magnetic field, said magnet means positioned adjacent said GaAs wafer so as to produce a Hall effect in said GaAs wafer;

means for measuring said magnetic field at said test sites;

a plurality of test probes positioned adjacent said GaAs wafer;

means connected to said support fixture for moving said GaAs wafer relative to said test probes to bring said set of ohmic contacts into contact with said test probes;

measuring means comprising a source of current and a voltage measuring device, and switching means for selectively connecting said source of current and voltage measuring device to said test probes;

means for storing values of voltages measured by said voltage measuring device and for storing values of magnetic field measured at said test sites;

means for calculating sheet resistance of said GaAs wafer at said test sites from a first series of voltages measured by said voltage measuring device;

means for calculating sheet Hall concentration in said GaAs wafer at said test sites from a second series of voltages measured by said voltage measuring device and from the magnetic field measured at said test sites; and means for calculating Hall mobility in said GaAs wafer at said test sites from calculations of said sheet Hall concentration and said sheet resistance.

2. The non-destructive measurement system according to claim 1 wherein said magnet means comprises a permanent magnet made of samarium cobalt.

3. The non-destructive measurement system according to claim 2, wherein said permanent magnet has a field strength of 1-2 kilogauss.

4. The non-destructive measurement system according to claim 3, further including a movable chuck positioned on said support fixture, said permanent magnet being secured on said movable chuck, said permanent magnet having a planar surface on which said GaAs wafer is positioned.

5. The non-destructive measurement system according to claim 4, further including suction means for securing said GaAs wafer to said permanent magnet.

6. The non-destructive measurement system according to claim 4, wherein said suction means includes a source of vacuum, and a plate positioned between said GaAs wafer and said permanent magnet having an aperture therethrough in alignment with each other and connected to said source of vacuum, said plate further including an annular groove in the surface thereof adjacent said permanent magnet, said groove being connected to said aperture and to said source of vacuum.

7. The non-destructive measurement system of claim 1, wherein said means for moving said GaAs relative to said test probe means comprises a computer controlled X-Y-Z axis drive apparatus.

8. The non-destructive measurement system according to claim 1, further including plotter means for generating a map of said sheet Hall concentration and said Hall mobility at said test sites.

* * * * *